United States Patent [19]

Engeler

[11] 4,005,377
[45] Jan. 25, 1977

[54] CONDUCTIVITY COUPLED SPLIT CAPACITOR SIGNAL PROCESSING DEVICE AND APPARATUS THEREFOR

[75] Inventor: William E. Engeler, Scotia, N.Y.

[73] Assignee: General Electric Company, Schenectady, N.Y.

[22] Filed: Sept. 2, 1975

[21] Appl. No.: 609,414

[52] U.S. Cl. .................... 333/70 T; 307/221 D; 357/24
[51] Int. Cl.² ............ H03H 7/28; H01L 29/78; H01L 29/10; H03K 25/02
[58] Field of Search ........... 333/70 T; 307/221 R, 307/221 C, 221 D, 304; 357/24; 235/181

[56] References Cited

UNITED STATES PATENTS

| | | | |
|---|---|---|---|
| 3,819,958 | 6/1974 | Gosney | 333/70 T X |
| 3,942,035 | 3/1976 | Buss | 307/221 D |

OTHER PUBLICATIONS

Ibrahim et al., "CCD's for Transversal Filter Applications"; IEEE IEDM Dec. 9, 10 and 11, 1974, Washington, D.C.; cover page and pp. 240–243.
Collins et al.—"Analog Matched Filters Using Charge Coupled Devices"; IEEE Nerem 72 Record, Oct. 31–Nov. 3, 1972; cover page and pp. 165–167.
Sangster—"The Bucket Brigade Delay Line, a Shift Register for Analogue Signals"; Phillips Technical Review, vol. 31, 1970, No. 4; pp. 97–110.

Primary Examiner—Saxfield Chatmon, Jr.
Assistant Examiner—Marvin Nussbaum
Attorney, Agent, or Firm—Julius J. Zaskalicky; Joseph T. Cohen; Jerome C. Squillaro

[57] ABSTRACT

In a charge transfer transversal filter a substrate of one conductivity type semiconductor material is provided. A plurality of electrodes insulatingly overlie the substrate and form therewith a plurality of stages of a charge transfer shift register. One electrode of each of the stages is split into a first and a second part with a small gap therebetween. A region of opposite conductivity type is provided in the substrate underlying each of the gaps to electrically couple the pair of storage regions underlying each of the one electrodes. A first clock line is connected to the first parts of the one electrodes. A second clock line is connected to the second parts of the one electrodes. Means are provided for applying phase related voltage to each of the stages of the shift register to effect transfer of charge from stage to stage. The same voltage is applied to the first and second clock lines.

8 Claims, 5 Drawing Figures

CONDUCTIVITY COUPLED SPLIT CAPACITOR SIGNAL PROCESSING DEVICE AND APPARATUS THEREFOR

The present invention relates in general to charge transfer devices and apparatus therefor and in particular to charge transfer transversal filters in which charge transfer devices with split electrodes are utilized to provide weighting in the various stages thereof.

A charge transfer transversal filter comprises a serial organization of N stages of closely coupled MOS (Metal-Oxide-Semiconductor) capacitors. Charge packets represenging sequential samples of an analog signal are serially inserted into the filter and are clocked at a rate $f_c = 1/T_c$ per sec, where $T_c$ is the period of the sampling, along the N stages of the filter. A charge packet emerges from the last stage $NT_c$ seconds after introduction or insertion into the filter. The filter includes means for non-destructively measuring and weighting the signal samples at each of the stages. The measuring and weighting of the signal samples simultaneously in all stages is achieved by setting the value of the capacitors, on which the signal samples are stored according to the desired tap weights. Tap weights are implemented in each of the stages by splitting the commonly phased electrodes of the capacitors of the stages into a A side or part and a B side or part. The A sides of the electrodes are connected together and to a first commonly phased line, and also the B sides of the electrodes are connected together and to a second commonly phased line. An electrode with a split at the center corresponds to a tap weight of zero. An electrode split such that the active portion of the electrode is connected to only the first commonly phase line corresponds to a tap weight of −1. An electrode split such that the active portion of the electrode is connected to only the second commonly phased line corresponds to a tap weight of +1. An electrode split at an intermediate point would provide a corresponding intermediate tap weight.

With such a means for providing tap weights, in order to obtain a sum of the weighted samples, the negatively weighted samples are summed on the first line and the positively weighted samples are summed on the second line. A differential amplifier connected to the first and second lines is utilized to obtain the net sum. Thus a surface charge transversal filter, such as described above, generates an output signal $s_{out}(t)$ which is the convolution of N samples of an input signal $S_{in}(t)$ with a set of N weighting factors ($W_n$) referred to as tap weights. The foregoing statement may be expressed mathematically as follows:

$$S_{out}(t) = \sum_{n=1}^{N} W_n S_{in}(t - nT_c). \quad (1)$$

The filter response is determined entirely by the choice of the set of N tap weights $W_n(n=1,N)$. If a particular response is desired it may be approximated by choosing the N tap weights appropriately.

The present invention is directed to the provision of improved charge transfer devices and in particular to the provision of improved split electrode charge transfer devices for use in charge transfer transversal filter apparatus.

Another object of the present invention is to provide a transversal filter utilizing split electrodes in which surface charge equilibration is obtained without the deleterious effects associated with prior art charge transfer filters.

Another object of the present invention is to provide in a charge transfer transversal filter an accurate tap weight at the various transfer sites thereof which is independent of the charge transferred.

A further object of the present invention is to provide improvements in charge transfer transversal filters.

In carrying out the present invention in an illustrative embodiment thereof there is provided a substrate of semiconductor material of one conductivity type. A plurality of electrodes insulatingly overlie the substrate and form therewith a plurality of stages of a charge transfer shift register. One electrode of each of the stages is split into a first part and a second part with a small gap therebetween. A region of opposite conductivity type is provided in the substrate underlying each of the gaps to electrically couple the pair of storage regions underlying each of the one electrodes. A first clock line is connected to the first parts of the one electrodes. A second clock line is connected to the second parts of the one electrodes. Means are provided for applying phase related voltages to each of the stages of the shift register to effect transfer of charge from stage to stage. The same voltage is applied to the first and second clock lines.

The features which are believed to be characteristic of the present invention are set forth with particularity in the appended claims. The invention itself, both as to its organization and method of operation, together with further objects and advantages thereof may best be understood by reference to the following description taken in connection in the accompanying drawings wherein:

Figure 1:
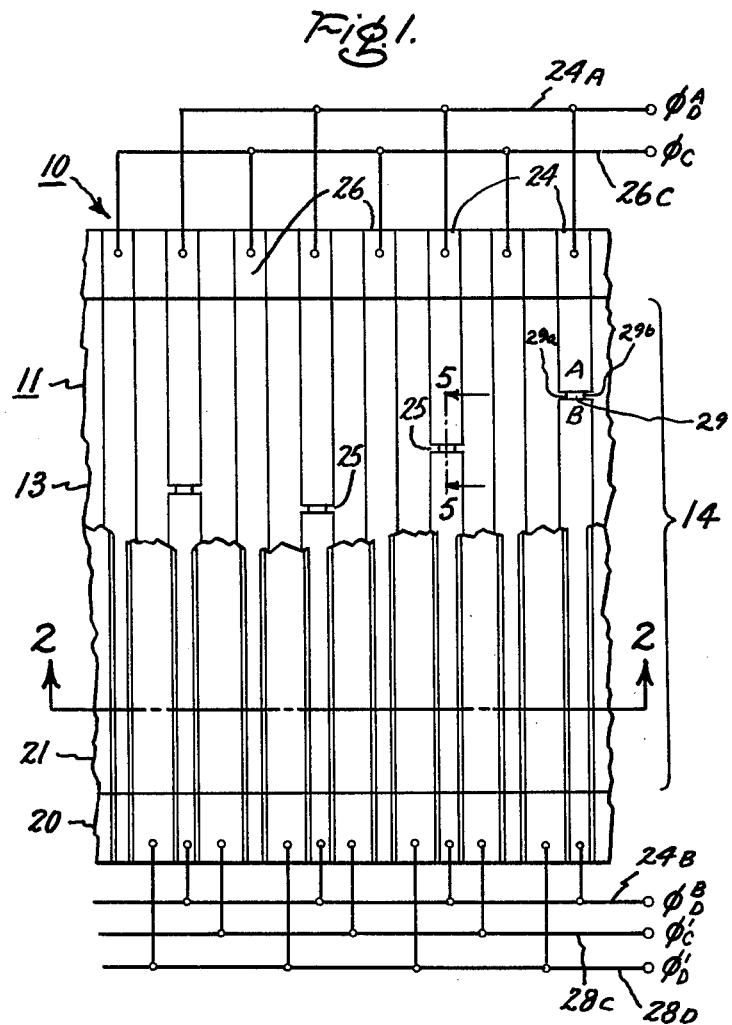
FIG. 1 shows a plan view of a charge transfer transversal filter embodying the present invention.
Figure 2:
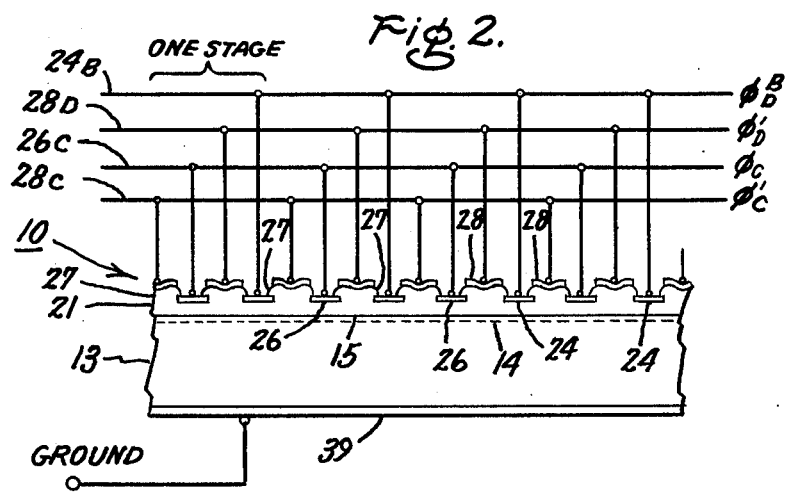
FIG. 2 is a sectional view of FIG. 1 taken along sectional lines 2—2 of FIG. 1.

Reference is now made to FIGS. 1 and 2 which show a portion of a transversal filter 10 including a charge coupled shift register 11 in accordance with the present invention. The shift register 11 is formed on a substrate 13 of N-type conductivity silicon semiconductor material which has a channel portion 14 of uniform width adjacent a major surface 15 of the substrate. Overlying the major surface of the substrate 13 is a thick insulating member 20 of silicon dioxide having a thin portion 21 of generally rectangular outline and lyng in registry with the channel portion 14 of the substrate. A first plurality of electrodes 24 are provided on the insulating member 20 overlying the thin portion 21 thereof and orthogonal to the length thereof. Each of the electrodes 24 is of uniform length in the direction of the length of the semiconductor channel portion 14 and each of the electrodes 24 extends across the thin insulatng portion 21 of the insulating member as well as over the bordering thick insulation portions of the insulating member 20. Each of the electrodes 24 of the first plurality has a split or gap 25 across the short dimension thereof over the first channel portion which divides the electrode into a first or A part and a second or B part.

Figure 5:
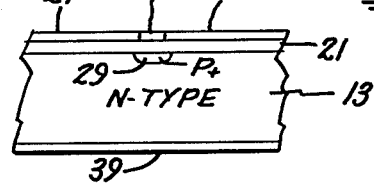
FIG. 5 is a section view of FIG. 1 taken along sectional lines 5—5 of FIG. 1.

The gap or split 25 in each of the electrodes 24 is small to allow the depletion regions or potential wells under the A and B parts to be coupled together efficiently to enable charge transferred to two potential wells under each electrode 24 to equilibrate, i.e. the charge in density under the A and B parts of the electrode is identical. In accordance with the present invention regions 29 of P-type conductivity are provided underlying each of the gaps 25 to enable this conduction or transfer of charge between adjacent potential wells of a split electrode 24 of the shift register as shown in FIG. 5 to achieve this equilibrium. Each of the P-type regions 29 is of generally rectangular outline as seen in FIG. 1. The sides $29_a$ and $29_b$ of the region 29 are recessed from the leading and lagging edges respectively of a split electrode 24 and the other sides of the region 29 underlies the A or first part and the B or second part of the split electrode 24. The highly conductive P-type region 29 may be formed by diffusion or ion implantation of P-type dopants into the substrate. The conductivity should be sufficiently high to allow rapid equilibration of charge carriers in the storage regions underlying the A and B parts of the electrode 24. It is generally advantageous to limit the extent of region 29. The overlap of parts A and B of electrode 24 with region 29 should therefore be kept to a minimum. It is particularly advantageous for this end to produce region 29 by means of a self registered process such as is commonly practiced in the art. By employing such processes an overlap of electrodes 24a and 24b with region 29 of no more than 1 micron (1 micrometer) may be provided. As shown the side 29a of the P-region 29 adjacent the leading edge of the electrode 24 is about in line with the edge of an overlying $\phi_D'$ electrode 28 and preferably should be overlaped by it. The sides 29a and 29b of the P-region 29 may be coextensive with the leading edge and lagging edges of the electrode 24, but preferably should not be situated beyond, outside the gap 25, as charge transfer would be undesirably funneled through the P-region to the storage sites underlying the A and B parts of electrode 24. Preferably these sides 29a and 29b should be recessed as far as possible into the gap 25 to avoid any interaction of region 29 with the transfer of charge between electrodes 24 and 26. Typically the electrodes 24 have a length (dimension in the direction of charge transfer in the channel 14) of about 0.6 mil and a gap 25 of about 0.2 mil from part A to part B of electrode 24. The P-region 29 may have a conductivity of the order to 100 ohms per square and a separation of edges 29a and 29b of slightly more than 0.3 mils. This high conductivity is particularly advantageous at low signal levels.

A second plurality of electrodes 26 which are unsplit are provided on the insulating member 20 overlying the thin portion 21 thereof and orthogonal to the length thereof. Each of the electrodes 26 is of uniform length in the direction of the length of the channel portion 14 and equal to the uniform length of each of the electrodes 24 of the first plurality. Each of the electrodes 26 of the second plurality are spaced between adjacent electrodes 24 of the first plurality and each extends completely over the thin insulating portion of the insulating member 20 as well as the bordering thick insulation portions of the insulating member 20. An insulating layer 27 is provided over the electrodes 24 and 26 of the first and second plurality. A plurality of transfer electrodes 28 are provided over the insulating layer 27, each of the transfer electrodes being insulatingly spaced between adjacent electrodes of the first and second pluralities and overlying the adjacent members thereof. Each of the transfer electrodes 28 is of substantially uniform extent in the direction of the length of the channel portion 14 and each electrode 28 extends entirely over the thin insulating portion 21 of the insulating member 20 as well as the bordering thick insulating portions thereof.

Figure 3:
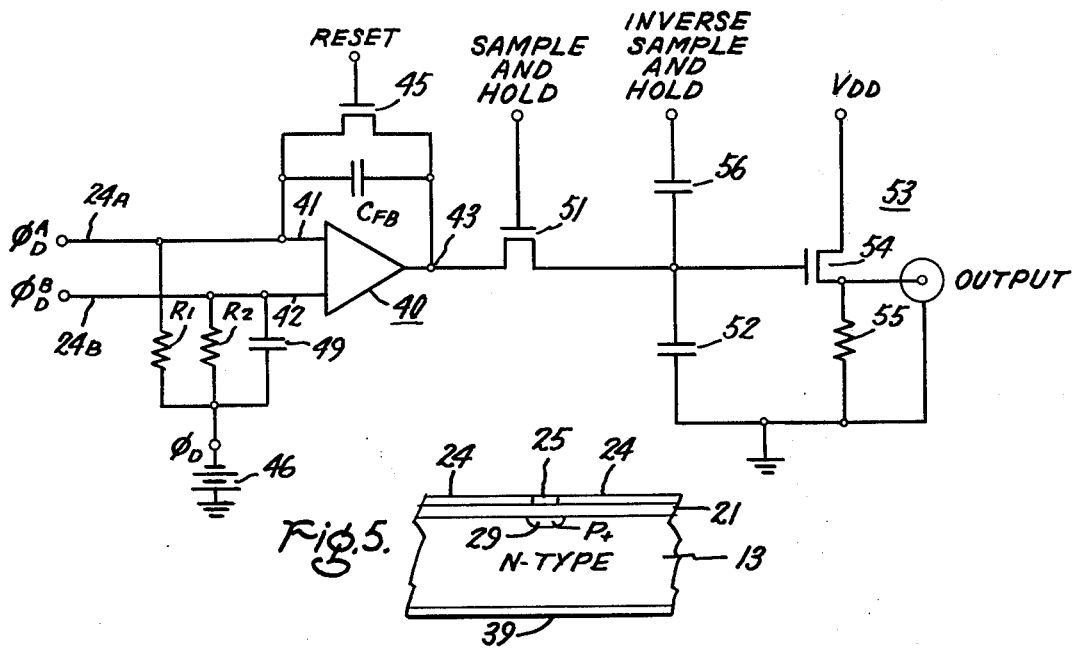
FIG. 3 is a schematic diagram of a differential sensing circuit in filtering apparatus of the present invention.
Figure 4:
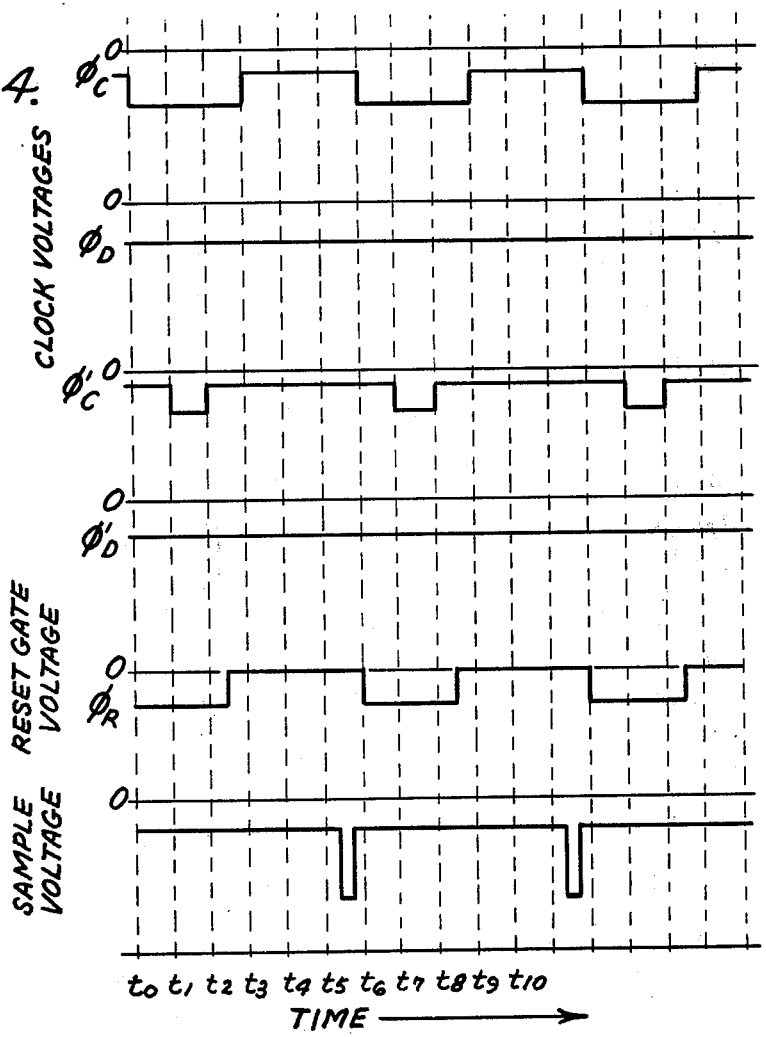
FIG. 4 is a diagram of voltage waveforms useful in explaining the operation of the transmittal filter apparatus of the invention.

All of the A or first parts of the electrodes 24 of the first plurality are connected to a common line 24A to which a $\phi_D$ voltage, $\phi^A_D$, is applied through the circuit of FIG. 3. All of the B or second parts of the electrodes 24 of the first plurality are connected to a common line 24B to which a $\phi_D$ voltage, designated voltage $\phi^B_D$, is applied through the circuit of FIG. 3. The manner of application of the $\phi_D$ voltage will be explained in connection with FIG. 3. All of the second plurality of electrodes 26 are connected to a common line 26C to which a voltage $\phi_C$ is applied which is shown in FIG. 4. All of the transfer electrodes 28 immediately preceding the split electrodes 24, that is on the input side thereof, are connected to a common line 28D. All of the transfer electrodes 28 located on the output side of the conductor members of the first plurality are connected to a common line 28C. A conductive layer 39 of a suitable material such as aluminum is bonded to the lower surface of the substrate 13 to provide a ground connection for the filter.

The portion of the transversal filter 10 shown in FIGS. 1 and 2 and described above is a portion of main shift register of the transversal filter described and claimed in patent application Ser. No. 609,415 filed Sept. 2, 1975 and assigned to the assignee of the present invention. The aforementioned application Ser. No. 609,415 is incorporated herein by reference thereto. The manner in which packets of charge varying in accordance with an analog signal are serially applied to the input of the shaft register 11, the manner in which the charge packets are clocked along the shift register and the manner in which charge is collected by a drain at the output of the shift register are described in the aforementioned application Ser. No. 609,415.

The manner in which packets of charge are transferred from stage to stage along the shift register of FIGS. 1 and 2 and the manner in which charge is sensed during such transfer will be described in connection with the output circuit of FIG. 3. The manner in which the stages of shift register are weighted has been described above and is more fully described in the aforementioned patent application Ser. No. 609,415. It has also been pointed out above that the difference between the charge induced on the lines 24A and 24b represents the convolution of the samples of an analog input signal with the weighting factors of the various stages of the transversal filter as set forth in equation 1 above. To this end there is provided a high gain differential amplifier 40 having an inverting input terminal 41, a non-inverting input terminal 42 and an output terminal 43. The differential amplifier may be any of a variety of operational amplifiers commercially available, for example, operational amplifier LM318 available from National Semiconductor Company of Santa Clara, Calif. The inverting input terminal 41 is connected to first line 24A interconnecting the A parts of the $\phi_D$ electrodes 24 of FIG. 1. The output terminal 43 is connected to the inverting input terminal 41 through a feedback capacitance $C_{FB}$. The potential of the inverting terminal 41 of the high gain differential amplifier with capacitance feedback follows the potential of the non-inverting terminal 42 and delivers a voltage at the output terminal 43 which is proportional to the difference in induced charge on the input line 24A divided by the feedback capacitance $C_{FB}$. A reset switch 45 in the form of a MOSFET transistor is connected across the feedback capacitor $C_{FB}$. A source 46 of fixed voltage having its positive terminal connected to ground provides $\phi_D$ voltage. A first resistor $R_1$ connected between the negative terminal of source 46 of $\phi_D$ voltage and the first line 24A provides a resetting and isolation function with respect to the first line and the electrodes connected thereto. A second resistor $R_2$ connected between the negative terminal of the source 46 of $\phi_D$ voltage and the second line 24B provides a resetting and isolation function with respect to the second line 24B. A capacitor 49 is connected between the non-inverting terminal 42 and the negative terminal of source 46. The capacitance 49 is equal to the capacitance of feedback capacitor $C_{FB}$ and is provided to maintain balance of capacitances on the two lines 24A to 24B to assure proper operation of the differential sensing circuit. It is assumed that the capacitances of lines 24A and 24B are substantially equal. If they are not, balance of the lines may be provided by use of the parallel shift register described in the aforementioned application Ser. No. 609,415. It should be noted that output terminal 43 has a relatively low impedance with respect to ground and is essentially at A-C ground. Accordingly, as the total capacitance on the first line 24A is equal to the total capacitance on the second line 24B, and the resistance $R_1$ and $R_2$ are equal, the time constants of the lines 24A and 24B are equal.

A sampling circuit is connected between output terminal 43 and ground, and comprises a MOSFET transistor 51 connected in series with a sampling capacitor 52. The source to drain conduction path of the MOSFET transistor 51 is connected in series with the sampling capacitor 52. The gate electrode of the MOSFET transistor 51 is connected to a source of sampling pulses, such as shown in FIG. 4. The output appearing across the sampling capacitor 52 is applied to a source follower circuit 53 which includes a MOSFET transistor 54, the source to drain conduction path of which is connected in series between a source of operating potential $V_{DD}$ and ground through an output impedance 55. The sampling capacitor 52 is connected between the gate of transistor 54 and ground. A voltage waveform which is the inverse of the sample voltage waveform of FIG. 4 is applied to sampling capacitor 52 through coupling capacitor 56 to cancel feed through of the sample pulses applied to transistor 51.

The manner in which the circuit of FIG. 3 connected to the transversal filter of FIG. 1 derives an output which is a measure of the difference in charges induced on the A parts of electrodes 24 connected to line 24A and the B parts of electrodes 24 connected to line 24B in response to the transfer of charge to the storage regions lying thereunder will now be explained in connection with the waveform diagrams of FIG. 4. The $\phi_C$, $\phi_C'$ and $\phi_D'$ voltages are applied, respectively, to lines 26C, 28C and 28D from suitable sources (not shown). The voltage $\phi_D$ is applied to the lines 24A and 24B from a source 46. Packets of charge representing signal samples are introduced at the input of the transversal filter 10 and are clocked along the semiconductor surface from stage to stage of the filter as fully explained in the aforementioned patent applicaton Ser. No. 609,415. However the manner in which charges are clocked along will now be briefly described in connection with FIGS. 1, 2 and 4. Typically, for an oxide thickness under the $\phi_C$ and $\phi_D$ electrodes 24 and 26 of about 1000 Angstrom Units and an oxide thickness under the $\phi_C'$ and $\phi_D'$ electrodes of about 2000 Angstrom Units, the voltage levels of the $\phi_C$ waveform are −6 and −28 volts, and the voltage levels of the $\phi_C'$ waveform are −3 and −22 volts. The voltage level of $\phi_D$ and $\phi_D'$ are, respectively, −15 and −9 volts. During the interval $t_0$–$t_1$ with the transfer gate voltage $\phi_C'$ at its least negative value, no charge is transferred from the storage sites underlying the $\phi_D$ electrodes to the storage sites underlying the $\phi_C$ electrodes. During the interval $t_1$–$t_2$ with the $\phi_C$ voltage and the transfer gate voltage $\phi_C'$ at their most negative values, charge is transferred from the storage sites underlying the $\phi_D$ electrodes to the storage sites underlying the $\phi_C$ electrodes. At a point in time between $t_3$ and $t_4$ the voltage applied to the $\phi_C$ and the $\phi_C'$ clock lines has decreased. Thus, the surface potentials of the storage regions underlying the $\phi_C$ electrodes 26 have been raised to a value above the surface potentials underlying $\phi_D$ electrodes 24 which are maintained at a constant value. Also, the surface potential of the substrate underlying the $\phi_C'$ electrodes has been raised to a value above the surface potential of the substrate underlying the $\phi_D'$ electrodes which are maintained at a constant value. Accordingly, the charge in the potential well underlying the $\phi_C$ electrodes flows into the potential well underlying the $\phi_D'$ electrodes. In order to assure transfer of charge in the potential wells underlying the $\phi_C$ electrodes to the potential wells underlying the $\phi_D$ electrodes, the voltage $\phi_C'$ is raised a short time earlier than the time of the rise in the $\phi_C$ voltage thereby establishing a barrier to the flow of charge in a direction opposite to the desired direction, i.e. the desired direction being from left to right in FIGS. 1 and 2. The shift registers of FIGS. 1 and 2, utilizing split electrodes which are maintained at a substantially fixed potential is particularly described and claimed in copending application Ser. No. 609,416 filed Sept. 2, 1976 and assigned to assignee of the present invention. The aforementioned application Ser. No. 609,416 is incorporated herein by reference thereto.

Continuing with the explanation of the operation of the circuit of FIG. 3, the reset switch 45 is closed from a time $t_0$ to a time somewhat after $t_2$, as seen from the reset waveform $\phi_R$ of FIG. 4 applied to the gate of transistor 45, and shorts out the feedback capacitor $C_{FB}$. During this interval the potential at the input terminal 41 is set equal to the potential on the output terminal 43 and the potential on input terminal 42. The potential on terminals 41, 42 and 43 of the differential amplifier would be essentially the potential of the $\phi_D$ source 46 assuming induced charge on line 24B has decayed to zero. At instant $t_3$, the $\phi_C$ voltage goes to its least negative value and thereby enables charge to be transferred from $\phi_C$ storage sites to the $\phi_D$ storage sites. The reset switch 45 is opened somewhat before $t_3$, as the reset voltage $\phi_R$ goes to zero at that time. Charge transfer from the $\phi_C$ to the $\phi_D$ storage sites occurs during the interval $t_3$–$t_6$. When surface charge transfers from the $\phi_C$ to the $\phi_D$ sites, an opposing charge which is proportional to the transferred charge is induced in the $\phi_D$ lines 24A and 24B. As the capacitance of line 24A is the same as the capacitance of line 24B and as the lines are isolated from source 46 by resistors $R_1$ and $R_2$, respectively, the charge transfer induces a voltage change on the lines proportional to the individual charges induced thereon. The interval of transfer of charge, i.e. $t_3-t_6$, is relatively short in comparison to the time constant of the total capacitance of the line 24A and resistance $R_1$ and in comparison to the time constant of the total capacitance of the line 24B and resistance $R_2$. As the high gain differential amplifier has capacitance feedback to the inverting terminal, the inverting input terminal 41 follows the potential of the non-inverting terminal 42. Thus a difference in induced charge on the first and second lines causes the amplifier to deliver charge from the output terminal to the inverting input terminal through the feedback capacitance to maintain equal voltage on the input terminals. Accordingly the difference in charge induced on the lines is represented by the change in voltage at the output terminal ($\Delta e_o$) times the feedback capacitance $C_{FB}$. With a differential amplifier with a fast slew rate, the new level of output voltage is reached rapidly. With the time constants associated with lines 24A and 24B relatively long with respect to the charge transfer time, the amplifier can quickly develop an output which is a measure of the difference in induced charge on the lines. Sampling the change in output level of voltage provides a measure of the sum of the weighted samples of the analog signal. The output voltage is sampled after the charge transfer has been completed and during the interval $t_5-t_6$ by energizing the MOSFET transistor 51 to charge the sampling capacitor 2 and thereby obtain a sample voltage which is a measure of the difference in charge delivered to the lines 24A and 24B. The sampled voltage is applied to the gate of the source follower 53 from which the output is obtained. As some of the sample pulse applied to the gate of transistor 51 may feed through to the source follower, the inverse of the sample pulse voltage is applied to the gate of the source follower 53 to cancel such feedthrough. After the transfer of charge from the $\phi_C$ storage sites to the $\phi_D$ storage sites, the voltages on the $\phi_D$ lines 24A and 24B due both to the transfer of charge and to the clock voltage fed through the interelectrode capacitances of the $\phi_C'$ electrodes with respect to $\phi_D$ electrodes, decay through the resistances $R_1$ and $R_2$. Each of the above voltages may be several volts. Note that the difference in voltage on the lines 24A and 24B upon the transfer of charge into the $\phi_D$ electrodes is measured in the order of tenths of a volt. Preferably, the time constant of resistance $R_1$ times the capacitance of the line 24A and also the time of constant of resistance $R_2$ times the capacitance of the line 24B are short in relation to the period of the clocking frequency, to assure resetting of the lines 24A and 24B to the $\phi_D$ voltage prior to transfer of another set of analog signal samples to the storage sites underlying the $\phi_D$ electrodes. However, this time constant should not be so short as to be comparable to the charge transfer interval and hence affect obtaining an accurate measure of the difference in charge induced on lines 24A and 24B. For accurate operation of the differential read out circuit the time constant of the capacitance of line 24A and resistance $R_1$ should be equal to the time constant of the capacitance of line 24B and resistance $R_1$. Actuation of the reset switch 45 at time $t_6$ after sampling has been accomplished causes the potential of terminal 41 to be fixed to the potential of the non-inverting terminal 42 by feedback action through the direct connection from the output terminal 43 to the inverting input 42 and also causes the feedback capacitance $C_{FB}$ to be completely discharged and readied for another sensing operation. Thus, in response to transfer of charge from the $\phi_C$ electrodes to the $\phi_D$ electrodes, the circuit responds at a fast rate to provide a change in level of output at terminal 43 which is an accurate measure of the difference in charge induced on the lines 24A and 24B and thereafter the voltages on the lines 24A and 24B and thereafter the voltages on the lines 24A and 24B decay at a relatively slow rate to the voltage $\phi_D$ of source 46 before the next cycle of transfer of charge from the sites underlying the $\phi_C$ electrodes to the sites underlying the $\phi_D$ electrodes.

As the $\phi_D$ electrodes connected to lines 24A and 24B are capacitively coupled to the $\phi_C'$ electrodes, clocking voltage on the $\phi_C'$ electrodes feeds through to the lines 24A and 24B. As the signal varies, both the inverting terminal 41 and non-inverting terminal 42 vary by the same amount and in the same direction when the coupling capacitances to the lines 24A and 24B are identical. The differential amplifier 40 rejects this common mode signal.

The differential readout circuit of FIG. 3 is described and claimed, including modifications, in a co-pending application Ser. No. 609,497 filed Sept. 2, 1975 and assigned to the assignee of the present invention. The aforementioned application Ser. No. 609,497 is incorporated herein by reference thereto. Other different readout circuits suitable for providing readout in the filter of the present invention are described and claimed in copending application Ser. No. 609,496 also filed Sept. 2, 1975 and assigned to the assignee of the present invention. The aforementioned application Ser. No. 609,496 is incorporated herein by reference thereto. An essential feature of the differential sensing circuit of FIG. 3, and also of the circuits of the above-mentioned patent applications Ser. No. 609,497 and Ser. No. 609,496 is that feedback around the amplifier 40 maintains the first and second parts of electrodes 24 at the same potential as they are connected respectively to lines 24A and 24B. If this were not done, charge that was initially correctly transferred into one of the two storage regions underlying the first and second parts of the electrodes 24 could transfer through the diffused region 29 to the other storage region. The diffused region, however, provides coupling between the two storage regions so that when electrodes 24A and 24B are maintained at the same potential charge may freely transfer between the storage regions until equilibrium is achieved. In this manner errors in the initial transfer of charge to the storage regions underlying electrodes 24A and 24B caused by local variations of transfer rate between the storage regions underlying electrode 26 and electrode 24 will be corrected and a uniform charge density achieved.

While the filter of the present invention has been shown and described in one phase mode of operation it is apparent that the filter may be operated in other modes, i.e. two or more phase modes.

While the filter of FIGS. 1 and 2 included transfer electrodes 28 in addition to the storage electrodes 24 and 26, it is readily apparent that the transfer electrodes 28 could be eliminated, if desired, and the electrodes 24 and 26 coupled sufficiently close together along the length thereof to provide a one phase or a two phase shift register utilizing the present invention. Also, it is apparent with the provision of an additional plurality of storage electrodes interleaved with the first and second pluralities of electrodes that a pair of three phase shift registers may be provided.

It is also apparent that whereas the filter has been described in terms of a "*p*-channel" device, i.e. a device in which the stored charge is in the form of positive charge carriers or "holes", an "*n*-channel" device may be similarly constructed by methods well known to those skilled in the art. In the *n*-channel device the stored and transferred charge is in the form of negatively charged carriers or electrons. This necessitates operation of the device with potentials of the opposite sign. Of course, with an *n*-channel device, the region 29 of FIG. 5 would be a region of N-type conductivity.

While the invention has been described in specific embodiments it will be appreciated that modifications, such as those described above, may be made by those skilled in the art and it is intended by the appended claims to cover all such modifications and changes as fall within the true spirit and scope of the invention.

What I claim as new and desire to secure by Letters Patent of the United States is:

1. A transversal filter comprising
    a substrate of one conductivity type semiconductor material,
    a plurality of electrodes insulatingly overlying said substrate and forming therewith a plurality of stages of a charge transfer shift register, one electrode of each of said stages being split into a first and a second part with a gap therebetween, a region of opposite conductivity type underlying a portion of each of said gaps to couple electrically the pair of storage regions underlying the first and second parts of respective ones of said electrodes,
    a first clock line connected to said first parts of said one electrodes,
    a second clock line connected to the second parts of said one electrodes,
    means for applying phase related voltages to each of the stages of said shift register to effect transfer of charge from stage to stage, the same phase related voltage being applied to said first and second clock lines.

2. The transversal filter of claim 1 including additional circuit means for maintaining said one electrode parts at the same potential.

3. The transversal filter of claim 1 wherein edges of said region of opposite conductivity type are in registry with the edges of said gap.

4. The transversal filter of claim 3 wherein the other edges of said region of opposite conductivity type are recessed from the edges of said gap.

5. The transversal filter of claim 1 in which is provided means for introducing packets of charge representing successive samples of an analog signal into said shift register and in which is provided differential sensing means connected between said first and second lines for detecting the difference in signal on said lines in response to the transfer of charge from stage to stage of said shift register.

6. The transversal filter of claim 5 in which said differential sensing means includes means for maintaining said lines at the same potential, whereby equal charge densities are maintained in each of the pair of storage regions underlying a respective one electrode.

7. The transversal filter of claim 6 in which differential sensing means includes a high gain differential amplifier having a pair of input terminals and an output terminal, one of said input terminals being an inverting input terminal and the other being a non-inverting terminal, a first capacitor, said inverting terminal connected to said output terminal through said first capacitor and also connected to said first line, said non-inverting terminal connected to said second line,
    whereby charge periodically transferred from storage region to storage region of said shift register induces different voltages on said lines and causes the voltage of the inverting terminal to follow the voltage of the non-inverting terminal by virtue of the feedback through said first capacitor and a total charge is supplied to said first capacitor which is proportional to the difference in charge delivered to said lines during said transfer of charge, said total charge appearing as a change in voltage at said output terminal.

8. The transversal filter of claim 1 in which the phase related voltage applied to said first and second clock lines is a fixed d-c voltage.

* * * * *